United States Patent
Nelson et al.

(10) Patent No.: US 10,665,759 B2
(45) Date of Patent: May 26, 2020

(54) REFLECTIVE STRUCTURE FOR LIGHT EMITTING DEVICES

(71) Applicant: Lumileds LLC, San Jose, CA (US)

(72) Inventors: Erik C. Nelson, Pleasanton, CA (US); Parijat P. Deb, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/714,613

(22) Filed: Sep. 25, 2017

(65) Prior Publication Data

US 2018/0090645 A1    Mar. 29, 2018

Related U.S. Application Data

(60) Provisional application No. 62/400,246, filed on Sep. 27, 2016.

(30) Foreign Application Priority Data

Jan. 6, 2017 (EP) .................................... 17150529

(51) Int. Cl.
*H01L 33/50* (2010.01)
*H01L 33/10* (2010.01)
(Continued)

(52) U.S. Cl.
CPC ........ *H01L 33/502* (2013.01); *H01L 33/0079* (2013.01); *H01L 33/10* (2013.01);
(Continued)

(58) Field of Classification Search
CPC .................................................. H01L 33/502
(Continued)

(56) References Cited

U.S. PATENT DOCUMENTS 5,862,167 A * 1/1999 Sassa ..................... H01L 33/105
257/98
6,002,700 A * 12/1999 Sato ........................ G02B 1/113
359/584

(Continued)

FOREIGN PATENT DOCUMENTS

WO    2016/054232 A1    4/2016

OTHER PUBLICATIONS

Butte et al., "Current status of AlInN layers lattice-matched to GaN for photonics and electronics," Journal of Physics D, Applied Physics, 40(20), 6328-6344 (Oct. 2007).

(Continued)

*Primary Examiner* — Igwe U Anya

(57) ABSTRACT

Described is a reflector for light emitting devices. A device includes a reflector in contact with a first n-type region and a second n-type region. The reflector includes multiple layers. One layer having an index of refraction different than the other layers. The device includes a light emitting region (LER) in contact with the second n-type region, a p-type region in contact with the LER and a light extraction region (LXR) in contact with the p-type region. A majority of light escapes the device through the LXR. The reflector reflects light emitted by the LER back towards the LXR. In another device, a reflector is embedded in a n-type region of the device. The device includes a LER, a p-type region, and a wavelength converter structure. The reflector reflects light emitted by the wavelength converting structure back towards the wavelength converting structure.

10 Claims, 4 Drawing Sheets

(51) Int. Cl.
*H01L 33/00* (2010.01)
*H01L 33/42* (2010.01)
*H01L 33/32* (2010.01)
*H01L 33/40* (2010.01)
*H01L 33/46* (2010.01)
*H01L 33/02* (2010.01)
*H01L 33/14* (2010.01)
*H01L 33/16* (2010.01)

(52) U.S. Cl.
CPC ............ *H01L 33/32* (2013.01); *H01L 33/405* (2013.01); *H01L 33/42* (2013.01); *H01L 33/46* (2013.01); *H01L 33/505* (2013.01); *H01L 33/025* (2013.01); *H01L 33/14* (2013.01); *H01L 33/16* (2013.01); *H01L 2933/0025* (2013.01); *H01L 2933/0091* (2013.01)

(58) Field of Classification Search
USPC .......................................................... 257/98
See application file for complete search history.

(56) References Cited

U.S. PATENT DOCUMENTS

| | | | | |
|---|---|---|---|---|
| 8,163,581 | B1* | 4/2012 | Or-Bach | H01L 31/0725 438/39 |
| 2005/0067627 | A1* | 3/2005 | Shen | H01L 33/08 257/89 |
| 2006/0284195 | A1* | 12/2006 | Nagai | F21K 9/00 257/98 |
| 2007/0102693 | A1* | 5/2007 | Nagai | F21K 9/00 257/13 |
| 2009/0278144 | A1* | 11/2009 | Sonobe | B82Y 20/00 257/98 |
| 2011/0227037 | A1 | 9/2011 | Su | |
| 2011/0284822 | A1* | 11/2011 | Jung | H01L 33/505 257/13 |
| 2013/0050686 | A1* | 2/2013 | Wunderer | G01N 21/41 356/128 |
| 2013/0308309 | A1* | 11/2013 | Schubert | H01L 33/50 362/231 |
| 2013/0313585 | A1* | 11/2013 | Jung | H01L 33/50 257/89 |
| 2014/0203292 | A1 | 7/2014 | Hwang et al. | |
| 2014/0203293 | A1 | 7/2014 | Hwang et al. | |
| 2014/0319553 | A1* | 10/2014 | Ye | H01L 33/0004 257/89 |
| 2015/0041822 | A1 | 2/2015 | Hwang et al. | |
| 2015/0194579 | A1* | 7/2015 | Chung | C09K 11/08 257/98 |
| 2016/0365479 | A1* | 12/2016 | Takeuchi | H01L 33/04 |
| 2017/0237234 | A1* | 8/2017 | Han | H01L 33/32 372/45.012 |

OTHER PUBLICATIONS

European Search Report dated May 29, 2017.

* cited by examiner

REFLECTIVE STRUCTURE FOR LIGHT EMITTING DEVICES

CROSS REFERENCE TO RELATED APPLICATIONS

This application claims the benefit of U.S. Provisional Application No. 62/400,246 filed on Sep. 27, 2016 and European Provisional Application No. 17150529.0 filed on Jan. 6, 2017, the contents of which are hereby incorporated by reference herein as if fully set forth.

FIELD OF INVENTION

This application is related to light emitting devices.

BACKGROUND

Semiconductor light-emitting devices including light emitting diodes (LEDs), resonant cavity light emitting diodes (RCLEDs), vertical-cavity surface-emitting laser (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

LEDs often have an emission surface from which a majority of light escapes the LED. The light emitting layers in an LED typically emit light in all directions. In addition, light may be reflected within the LED, for example by total internal reflection at the interface between two materials with different indices of refraction. Light emitted or reflected in directions away from the emission surface may be undesirably absorbed within the LED.

SUMMARY

Described herein is a reflective structure for light emitting devices and methods for making the same. A light emitting device includes a reflector in contact with a first n-type region and a second n-type region. The reflector can include multiple layers, where one layer has an index of refraction different than the other layers. The light emitting device further includes a light emitting region in contact with the second n-type region, a p-type region in contact with the light emitting region and a light extraction region in contact with the p-type region. The light emitting device has a majority of light escaping through the light extraction region and the reflector being tuned to reflect light emitted by the light emitting region back toward the light extraction region. In another light emitting device, a reflector is embedded in an n-type region of the light emitting device. The light emitting device further includes a light emitting region in contact with the n-type region, a p-type region in contact with the light emitting region and wavelength converter structure in contact with the p-type region. The reflector being tuned to reflect light emitted by the wavelength converting structure back toward the wavelength converting structure.

BRIEF DESCRIPTION OF THE DRAWINGS

A more detailed understanding may be had from the following description, given by way of example in conjunction with the accompanying drawings wherein.

DETAILED DESCRIPTION

It is to be understood that the figures and descriptions for a reflective structure for light emitting devices and methods for making the same have been simplified to illustrate elements that are relevant for a clear understanding, while eliminating, for the purpose of clarity, many other elements found in typical device processing. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Described herein are a reflective structure for a light emitting device and methods for making the same. In general, a reflective structure is disposed on a surface of or within an n-type region of an III-nitride semiconductor structure. The reflective structure may include multiple layer pairs of alternating high and low indices of refraction, which reflects light through total internal reflection. An illustrative example of a reflective structure is a distributed Bragg reflector (DBR). Other reflectors can be used without departing from the scope of the description and claims herein.

Though in the examples and embodiments described herein the semiconductor light emitting device is an III-nitride light emitting diode (LED) that emits blue or UV light, semiconductor light emitting devices besides LEDs, such as laser diodes, are within the scope of the invention. In addition, the principles described herein may be applicable to semiconductor light emitting devices made from other materials systems such as other III-V materials, III-phosphide, III-arsenide, II-VI materials, ZnO, or Si-based materials.

Figure 1:
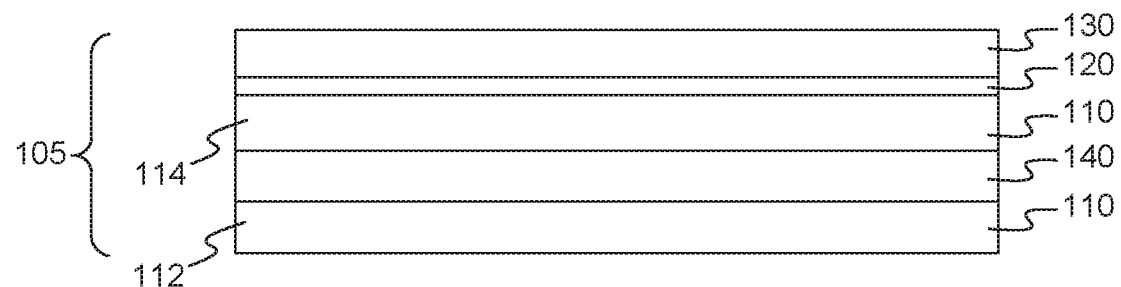
FIG. 1 is a cross-section of an illustrative semiconductor structure including a reflector in accordance with certain implementations.
Figure 2:
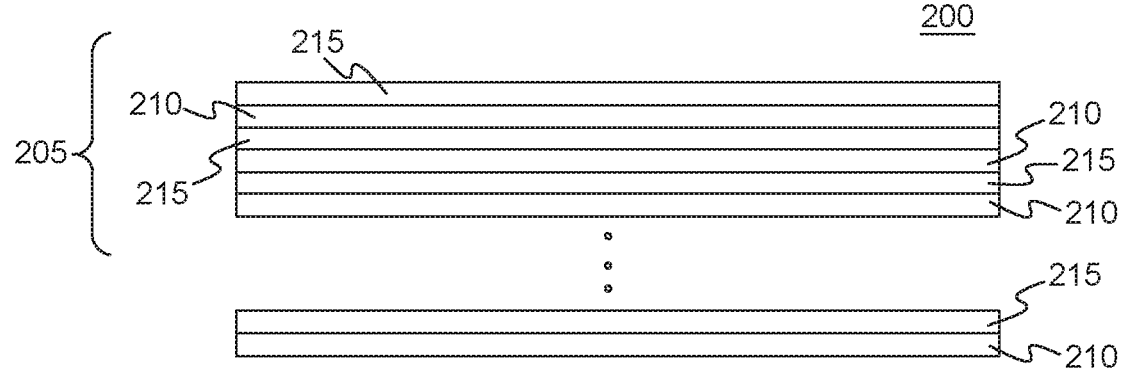
FIG. 2 is a cross-section of a reflector in accordance with certain implementations.

FIG. 1 is an illustrative semiconductor structure 105 of a device 100, which can be grown or fabricated as illustrated in flow diagram 200 of FIG. 2. Device 100 can be, for purposes of illustration, a III-nitride LED. Any suitable semiconductor light emitting device may be used and implementations of the invention are not limited to the structure illustrated in FIG. 1.

Device 100 is formed by growing a III-nitride semiconductor structure on a growth substrate (not shown). The growth substrate is often sapphire but may be any suitable substrate such as, for example, silicon carbide (SiC), silicon (Si), gallium nitride (GaN), or a composite substrate. A surface of the growth substrate on which the III-nitride semiconductor structure is grown may be patterned, roughened, or textured before growth, which may improve light extraction from device 100. A surface of the growth substrate opposite the growth surface, (i.e. the surface through which a majority of light is extracted in a flip chip configuration), may be patterned, roughened or textured before or after growth, which may improve light extraction from device 100.

In an implementation, device 100 includes an n-type region 110, a p-type region 130 and a light emitting or active region 120 sandwiched between n-type region 110 and p-type region 130. A reflector 140 is disposed within n-type region 110 and in particular, reflector 140 is disposed between a first portion 112 of n-type region 110 and a second portion 114 of n-type region 110. As described herein below, reflector 140 may be disposed adjacent a surface of n-type region 110 rather than buried within n-type region 110.

N-type region 110 may include, but is not limited to, multiple layers of different compositions and dopant concentration including, for example, preparation layers such as buffer layers or nucleation layers, layers designed to facilitate removal of the growth substrate, which may be n-type or not intentionally doped, and/or n-type or p-type device layers designed for particular optical, material, or electrical properties desirable for light emitting region 120 to efficiently emit light.

Light emitting region 120 may include, but is not limited to, a single thick or thin light emitting layer, or a multiple quantum well light emitting region including multiple thin or thick light emitting layers separated by barrier layers, for example.

P-type region 130 may include, but is not limited to, multiple layers of different composition, thickness, and dopant concentration, including layers that are not intentionally doped or n-type layers.

FIG. 2 is an illustrative diagram of a reflector 200. FIG. 2 is illustrative and any suitable reflector may be used. For example, although reflector 200 illustrates two layer types, suitable reflectors may have more than two layer types. In general, reflector designs can be complex and can have a variety of layer thicknesses and indices of refraction to create a wide spectral response in the reflector, for example. Different features of the layers or of the reflector described in the examples below, such as, for example, composition, dopant concentration, and the like may be used in different examples of reflectors. Different features of the layers or of the reflector can be combined in different examples.

In an implementation, reflector 200 includes a plurality of layer pairs 205 epitaxially grown on a n-type region, such as n-type region 110 in FIG. 1 or other underlying semiconductor layer. Each layer pair 205 includes a lower index of refraction layer 210 and a higher index of refraction layer 215. In an implementation, layers 210 and 215 are in alternating configuration. The contrast in index of refraction between layers 210 and 215 causes light to be reflected at the surface of or within reflector 200. The number of layer pairs 205 and the characteristics of layers 210 and 215 are selected to optimize the reflectivity of reflector 200. The order of lower index of refraction layer 210 and a higher index of refraction layer 215 in FIG. 2 is illustrative only, as the order of lower index of refraction layer 210 and a higher index of refraction layer 215 can be reversed. Order selection can vary depending on implementation in, for example, device 100.

In an implementation, the difference in index of refraction between layers 210 and 215 is due to the composition of layers 210 and 215. An illustrative structure and composition for a reflector is a semiconductor distributed Bragg reflector (DBR). For example, lower index of refraction layers 210 may be aluminum indium nitride (AlInN), and higher index of refraction layers 215 may be gallium nitride (GaN). For AlInN type lower index of refraction layers 210, the indium (InN) composition may be at least 14% in some implementations, no more than 21% in some implementations, at least 17% in some implementations, and no more than 18% in some implementations. These InN compositions are sufficiently lattice matched to GaN type higher index of refraction layers 215 that they can be grown with suitable material quality (for example, they can be grown without introducing defects or causing the material to relax). The more closely lattice matched the two layers, the thicker each layer may be grown without introducing defects or cracking.

In an implementation where the lower index of refraction layers 210 are AlInN and the higher index of refraction layers 215 are GaN, the indices of refraction are as follows: n_GaN=2.41, and n_AlInN=2.25. The indices of refraction for the lower and higher index of refraction layers may vary +/−10% from the indices given above. The refractive index values listed are at 480 nm and vary with wavelength. The index values for both the lower and higher index of refraction layers typically will increase as wavelength gets shorter.

In an implementation, layers 210 and 215 in reflector 200 can be doped. In an implementation, all layers of reflector 200 are doped to a substantially uniform dopant and/or carrier concentration. In an implementation, reflector 200 is doped in a modulated fashion, where different layers may be doped to different dopant and/or carrier concentrations. Modulated doping may minimize any changes in electrical properties between the layers. For example, if the electron mobility of two adjacent layers differs, the doping can be changed from the first layer to the second layer to at least compensate for the difference in electron mobility. This maintains a constant conductivity of the layer, or reduces the difference in electron mobility as compared to the case where the first and second layers are undoped or uniformly doped.

In an implementation, the difference in index of refraction between layers 210 and 215 is due to different porosity in layers 210 and 215. Increasing the porosity of a layer typically reduces the index of refraction. Accordingly, lower index of refraction layers 210 may be more porous than higher index of refraction layers 215. In an implementation, lower index of refraction layers 210 are porous, and higher index of refraction layers 215 are not porous. In an implementation, lower index of refraction layers 210 and higher index of refraction layers 215 are both porous, but higher index of refraction layers 215 are less porous than lower index of refraction layers 210.

Porosity in reflector 200 may be created in a post-growth process. In an implementation, the semiconductor or III-nitride structure to be made porous is exposed to an electrolyte. The III-nitride structure is coupled to one terminal of a power supply. The other terminal of the power supply is immersed in the electrolyte to complete a circuit. Energizing the circuit causes the electrolyte to etch the III-nitride material to increase the porosity of the III-nitride material in contact with the electrolyte. For example, a platinum wire connected to a III-nitride layer to be made porous serves as the anode. The other end of the platinum wire serves as the cathode. A wafer on which the III-nitride layer is grown and the platinum wire are immersed in a 2M NaOH solution. A direct current is applied through the wire and wafer, for example at a density between 10 and 20 mA/cm2. Optional ultra-violet (UV) illumination is supplied by a 250 W mercury lamp. An appropriate porosity may require 10 to 60 minutes of processing, after which the lamp and the current source are switched off. In an implementation, platinum may be applied directly over the surface of the wafer, or different solutions such as KOH, fluoride acids, oxalic acid, or CH3OH:HF:H2O2 are used in a photo-electro-chemically driven process.

In an implementation, reflector 200 is grown such that lower index of refraction layers 210 are more highly doped, and higher index of refraction layers 215 are less doped. During the post-growth process that creates porosity in reflector 200, the more highly doped layers become more porous than the less doped layers. The composition of the more highly doped layers 210 and the less doped layers 215 may be the same or different.

In an implementation, where at least one of layers 210 and 215 is made at least partially porous, the at least partially porous layer may be grown from any III-nitride material.

In an implementation, where at least one of layers 210 and 215 is made at least partially porous, the at least partially porous layer may be doped to a dopant or carrier concentration of at least $10^{17}$ cm$^{-3}$ in some implementations and no more than 1019 cm$^{-3}$ in some implementations. Doping concentration may be varied to control the porosity.

In an implementation, after reflector 200 including all layer pairs 210 and 215, and/or the entire semiconductor structure, including the reflector structure and the active and p-type regions, is grown, then all or a portion of reflector 200 is made porous, for example by etching. The etching may proceed from the sides of the material, for example. When during the post-growth processing reflector 200 is made porous may depend on, for example, the etching rate and the size of the final die. For example, etching to make reflector 200 porous may be done after trenches are formed that separate each die, such that the etching may proceed laterally from the edges of each die, rather than just from the edges of the wafer.

In an implementation, where at least one of layers 210 and 215 is made at least partially porous, the at least one partially porous layer may have a thickness of at least $\lambda n/4$ in some implementations and no more than $\lambda n/2$ in some implementations, where $\lambda n$ is the wavelength of light in the semiconductor material, or the wavelength in vacuum (or air, essentially) divided by the refractive index. The thicknesses of layers 210 and 215 may depend on both the composition of the material, and the emission wavelength of the LED. In an implementation, if $\lambda n$ is between 250 nm and 600 nm, the thickness of each of layers 210 and 215 may be at least 20 nm and no more than 150 nm.

In an implementation, where at least one of layers 210 and 215 is made at least partially porous, the at least one partially porous layer may have an index of refraction no more than the index of refraction of the bulk (nonporous) material, (for example, no more than 2.5), in some implementations, at least 1.2 in some implementations, and at least 1.3 in some implementations. The index of refraction in each layer depends on the porosity of that layer.

In an implementation, reflector 200 is grown such that lower index of refraction layers 210 are a composition that is preferentially etched by the post-growth process and therefore becomes more porous, and higher index of refraction layers 215 are a composition that is not preferentially etched by the post-growth process and therefore becomes less porous. During the post-growth process that creates porosity in reflector 200, layers 210 become more porous than layers 215. In an implementation, layers 210 and 215 are InGaN and AlGaN, respectively. In an implementation, the InGaN and AlGaN layers may have a high composition of GaN.

In an implementation, reflector 200 may include at least 3 layer pairs 205 (or groups of layers, in the case where more than two layer types are repeated) in some implementations, at least 4 layer pairs 205 or groups of layers in some implementations, no more than 50 layer pairs 205 or groups of layers in some implementations, and at least 30 layer pairs 205 or groups of layers in some implementations. The number of pairs may be influenced by the refractive index difference between layers 210 and 215. For the same reflectivity, a larger difference in index of refraction allows the use of fewer pairs or groups of layers.

Figure 3:
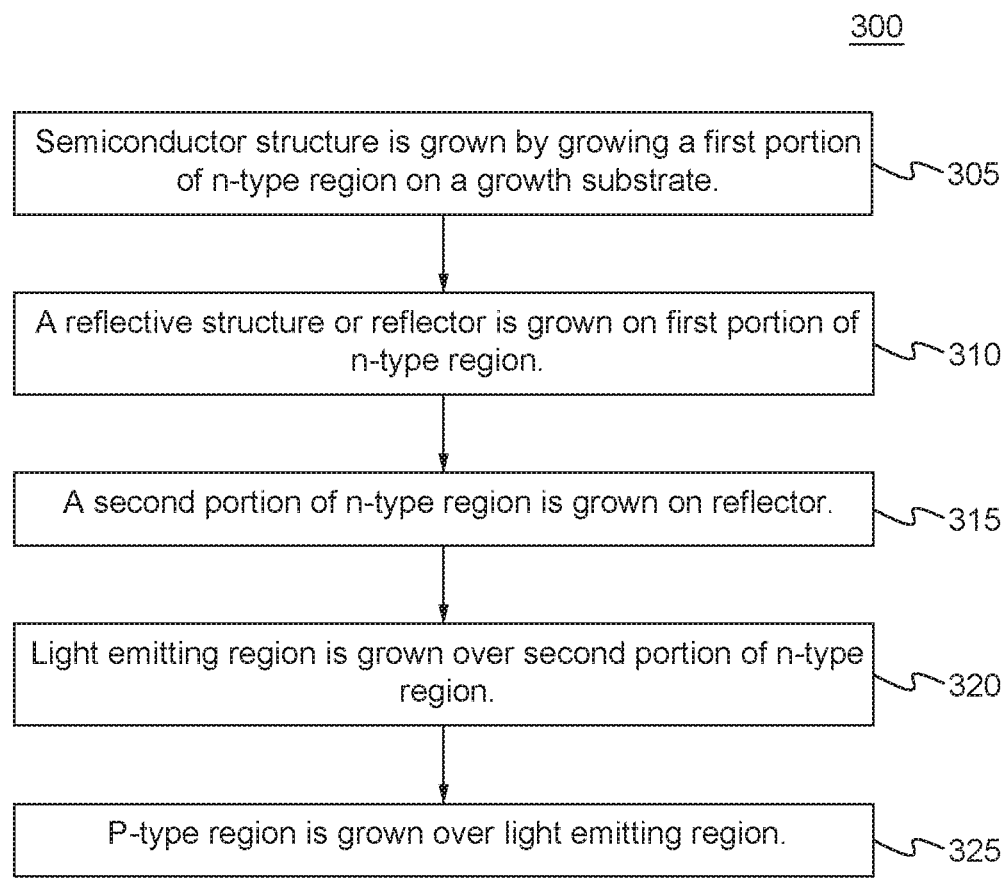
FIG. 3 is an illustrative flow diagram for growing the light emitting device of FIGS. 1 and 2 in accordance with certain implementations.

FIG. 3 is an illustrative flow diagram 300 for growing the light emitting device of FIGS. 1 and 2 in accordance with certain implementations. Semiconductor structure 105 is grown by growing a first portion 112 of n-type region 110 on a growth substrate (not shown) (305). A reflective structure or reflector 140 is grown on first portion 112 of n-type region 110 (310) as described herein above. A second portion 110 of n-type region 110 is grown on reflector 140 (315). Light emitting region 120 is grown over second portion 110 of n-type region 110 (320). P-type region 130 is grown over light emitting region 120 (325). Growth order is illustrative. In an implementation, as described herein, reflector 140 can require post-processing activity to, for example, induce porosity. The post-processing activity can be, for example, etching as described herein.

Figure 4:
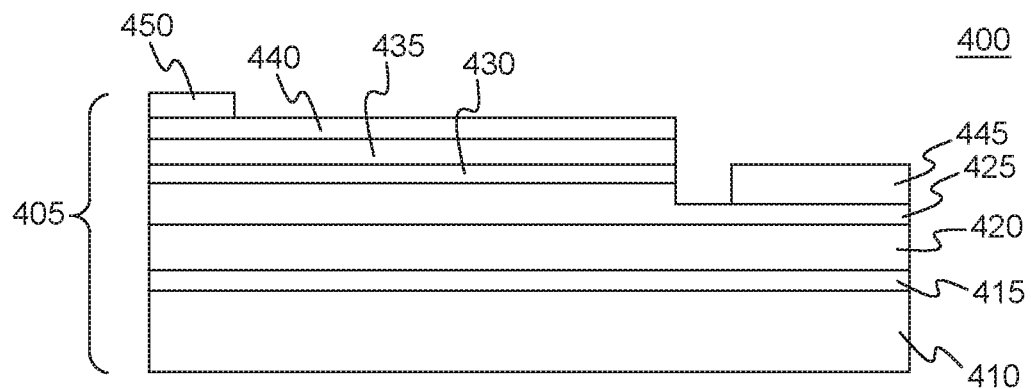
FIG. 4 is a cross sectional view of a lateral light emitting device, where an emission surface is a surface of a semiconductor structure on which contacts are formed, in accordance with certain implementations.
Figure 5:
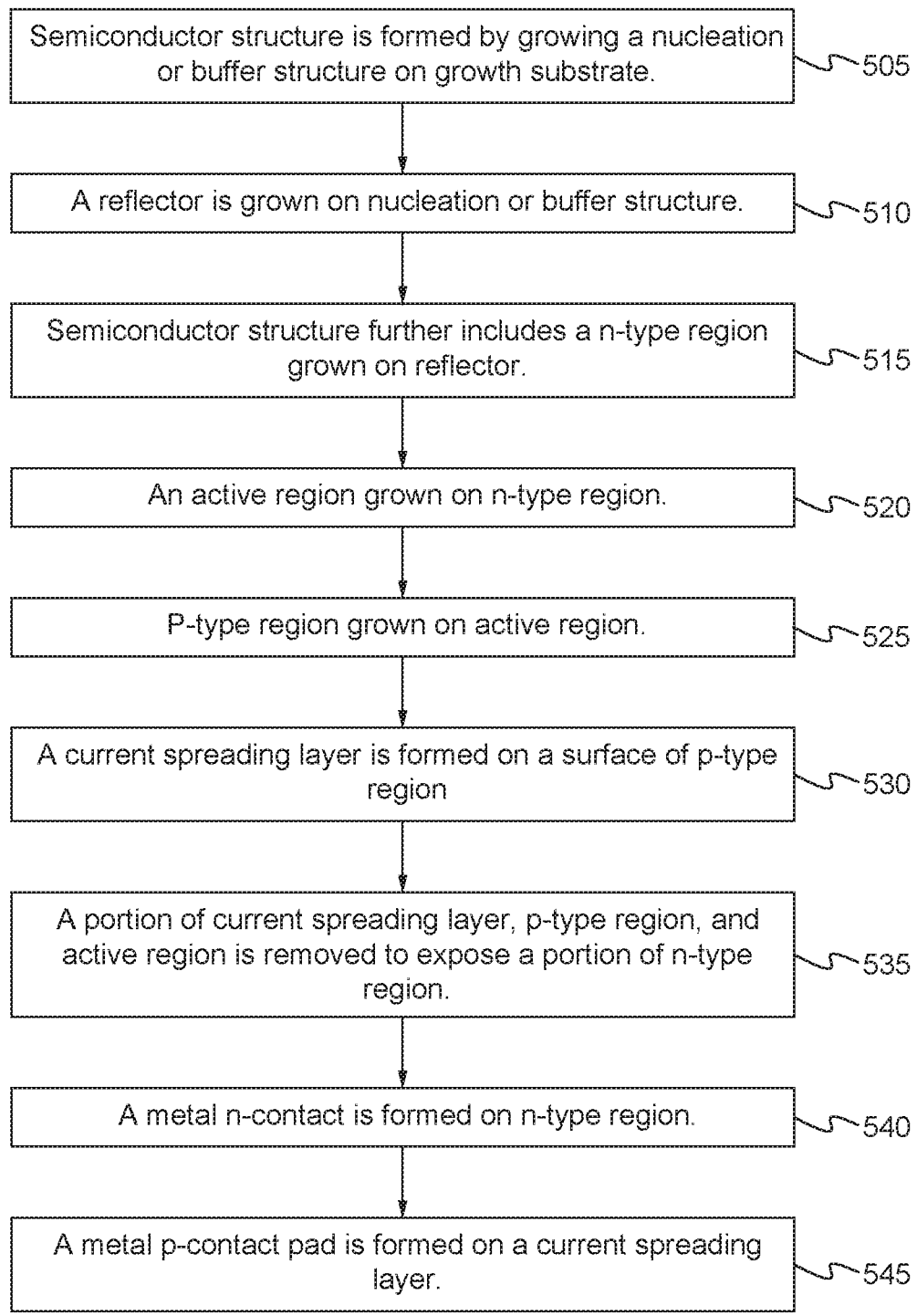
FIG. 5 is an illustrative flow diagram for making the light emitting device of FIG. 4 in accordance with certain implementations.

FIG. 4 is a cross sectional view of a lateral light emitting device 400 which is grown as illustrated in flow diagram 500 of FIG. 5. In device 400, a majority of light escapes a semiconductor structure 405 through an emission surface, the emission surface being defined as the surface where contacts are formed for device 400.

Device 400 includes a semiconductor structure 405 grown on a growth substrate 410. Growth substrate 410, can be, but is not limited to, a non-III-nitride substrate, sapphire or the like. Semiconductor structure 405 is formed by growing a nucleation or buffer structure 415 on growth substrate 410 (505). Nucleation or buffer structure 415 is poor quality material and therefore absorbs a significant portion of light incident on nucleation or buffer structure 415. A reflector 420 is grown on nucleation or buffer structure 415 (510). Semiconductor structure 405 further includes a n-type region 425 grown on reflector 420 (515), an active region 430 grown on n-type region 425 (520), and a p-type region 435 grown on active region 430 (525). In an implementation, reflector 420 may be embedded in n-type region 425 as described herein above with respect to FIG. 1.

A current spreading layer 440 is formed on a surface of p-type region 435 (530). Current spreading layer 440 may be, but is not limited to, a thin, substantially transparent metal layer through which light may be extracted, or a transparent conductive oxide layer such as indium tin oxide. A portion of current spreading layer 440, p-type region 435, and active region 430 is removed to expose a portion of n-type region 425 (535) on which a metal n-contact 445 is formed (540). A metal p-contact pad 450 is formed on a current spreading layer 440 (545). In an implementation, as described herein, reflector 420 can require post-processing activity to, for example, induce porosity. This can be, for example, after a portion of n-type region 425 is exposed and prior to forming metal n-contact 445 on exposed portion of n-type region 425. The post-processing activity can be, for example, etching as described herein.

As described herein, reflector 420 is tuned to reflect light emitted by active region 430 in the direction of nucleation or buffer structure 415 toward the emission surface, to reduce or prevent absorption of light by nucleation or buffer structure 415. In this implementation, orientation of the emission surface is defined by the surfaces on which metal n-contact 445 and metal p-contact pad 450 are formed.

Figure 6:
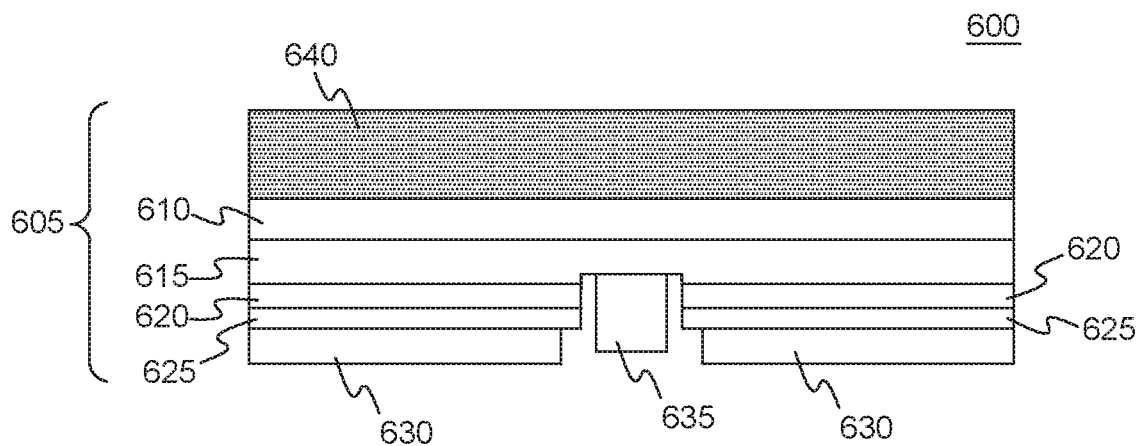
FIG. 6 is a cross sectional view of a flip chip light emitting device including a wavelength converting material, where the emission surface is a surface of the semiconductor structure facing the wavelength converting material, in accordance with certain implementations.
Figure 7:
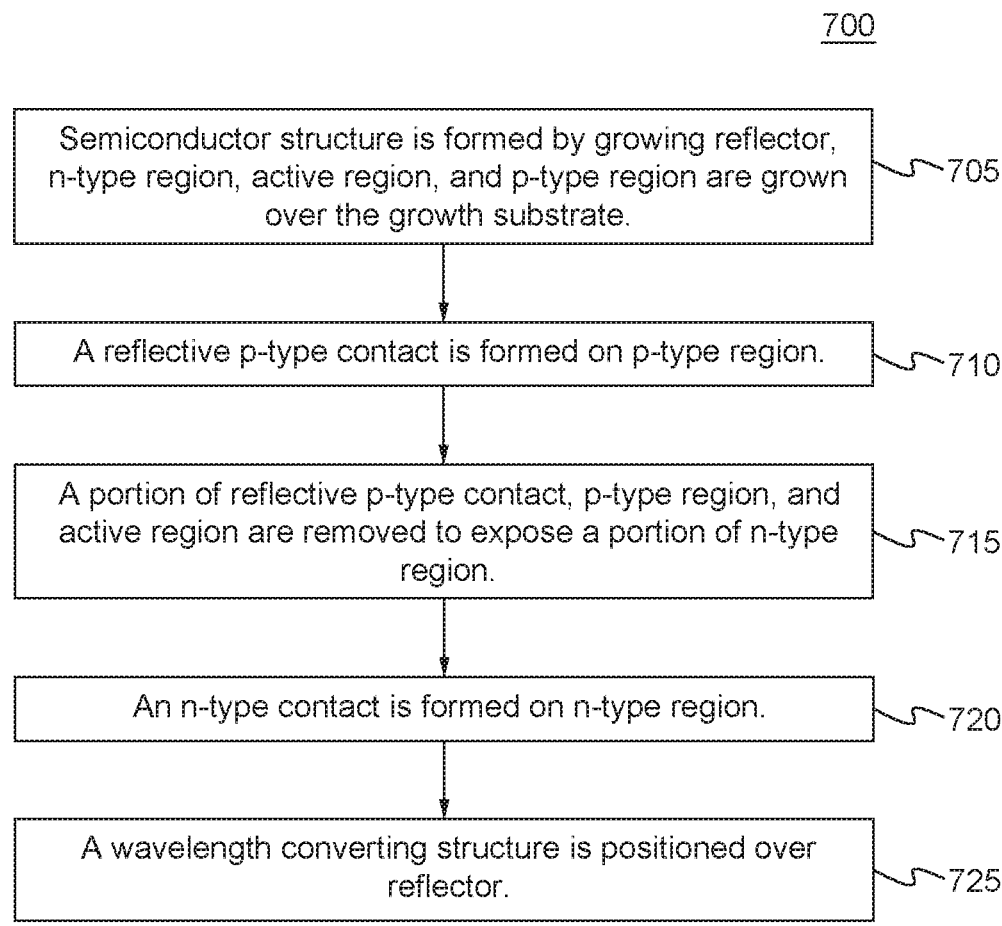
FIG. 7 is an illustrative flow diagram for making the light emitting device of FIG. 6 in accordance with certain implementations.

FIG. 6 is a cross sectional view of a flip chip light emitting device 600 which is grown as illustrated in flow diagram 700 of FIG. 7. In device 600, the emission surface is a surface of a semiconductor structure 605 that faces a wavelength converting structure 640.

Device 600 includes a semiconductor structure 605 grown on a growth substrate (not shown). Semiconductor structure 605 is formed by growing reflector 610, n-type region 615, active region 620, and p-type region 625 are grown over the growth substrate (705). In an implementation, reflector 610 may be embedded in n-type region 615 as described herein above with respect to FIG. 1. A reflective p-type contact 630 is formed on p-type region 625 (710). In an implementation, reflective p-contact 630 often includes multiple conductive layers such as a reflective metal and a guard metal which may prevent or reduce electromigration of the reflective metal. In an implementation, the reflective metal is silver but any suitable material or materials may be used. A portion of reflective p-type contact 630, p-type region 625, and active region 620 are removed to expose a portion of n-type region 615 (715) on which an n-type contact 635 is formed (720). A wavelength converting structure 640 is positioned over reflector 610 (725).

N-type contact 635 and p-contact 630 are electrically isolated from each other by a gap. In an implementation, the gap may be filled with a dielectric such as an oxide of silicon or any other suitable material. In an implementation, multiple n-type contact vias may be formed. The arrangement of n-type contact 635 and p-type contact 630 shown in FIG. 6 are illustrative and other arrangements can be used. In an implementation, n-type contact 635 and p-type contact 630 may be redistributed to form bond pads with a dielectric/metal stack, as is known in the art. Reflector 610 is tuned to reflect any wavelength-converted light that is emitted by wavelength converting structure 640 back toward wavelength converting structure 640. Reflector 610 is tuned to be transparent to light emitted by active region 620 in the direction of wavelength converting structure 640.

In an implementation, n-type contact 635 and p-type contact 630 may be sufficiently thick to support semiconductor structure 605. In an implementation, device 600 may be attached to a mount (not shown) to support semiconductor structure 605. The growth substrate may be removed, for example by etching or laser lift-off. In some implementations, an III-nitride structure exposed by removing the growth substrate may be thinned, for example to remove poor quality nucleation or buffer material, and/or to expose reflector 610.

Wavelength converting structure 640 includes one or more materials that absorb light emitted by active region 620 and emit light of a longer wavelength. Examples of wavelength converting materials include conventional phosphors, organic phosphors, quantum dots, organic semiconductors, II-VI or III-V semiconductors, II-VI or III-V semiconductor quantum dots or nanocrystals, dyes, polymers, or other materials that luminesce. Examples of wavelength converting structures can include, but is not limited to: luminescent ceramic tiles; wavelength converting materials such as powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over the LED; wavelength converting materials such as powder phosphors that are mixed with a transparent material such as silicone and dispensed, screen printed, stenciled, molded, or otherwise disposed over the LED; and wavelength converting materials that are coated on the LED or another structure by electrophoretic, vapor, or any other suitable type of deposition. In an implementation, the wavelength converting structures may be attached to the LED by an adhesive layer.

The wavelength converting materials absorb light emitted by the LED and emit light of one or more different wavelengths. Unconverted light emitted by the LED is often part of the final spectrum of light extracted from the structure, though it need not be. Examples of common combinations include, but are not limited to: a blue-emitting LED combined with a yellow-emitting wavelength converting material; a blue-emitting LED combined with green- and red-emitting wavelength converting materials; a UV-emitting LED combined with blue- and yellow-emitting wavelength converting materials; and a UV-emitting LED combined with blue-, green-, and red-emitting wavelength converting materials. Wavelength converting materials emitting other colors of light may be added to tailor the spectrum of light extracted from the structure.

In some implementations, other materials may be added to wavelength converting structure 640 or device 600, such as, for example, materials that improve optical performance, materials that encourage scattering, and/or materials that improve thermal performance.

The embodiments described herein may be incorporated into any suitable light emitting device. Embodiments of the invention are not limited to the particular structures illustrated, such as, for example, the vertical devices of FIGS. 1, 4 and 6.

The non-limiting methods described herein for making reflective structures for a light emitting device may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the method for making reflective structures in light emitting devices although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of a reflective structure for light emitting devices and methods for making the same as described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A device comprising:
   a n-type region;
   a reflector embedded in the n-type region, the reflector including a plurality of layers and at least one layer of the plurality of layers having an index of refraction different than other layers of the plurality of layers;
   a light emitting region in contact with the n-type region;
   a p-type region in contact with the light emitting region; and
   a wavelength converting structure in contact with the n-type region and configured to absorb light emitted by the light emitting region and in response emit light of a longer wavelength;
   the plurality of layers in the reflector arranged and configured to transmit light emitted by the light emitting region into the wavelength converting structure and to reflect longer wavelength light emitted by the wavelength converting structure toward the n-type region back toward the wavelength converting structure.

2. The device of claim 1, wherein the at least one layer is a first plurality of layers alternating with a second plurality of layers of the plurality of layers, the first plurality of layers being more porous than the second plurality of layers.

3. The device of claim 1, wherein at the least one layer is more highly doped than the other plurality of layers.

4. The device of claim 1, wherein the at least one layer is a porous semiconductor layer and the other plurality of layers are non-porous semiconductor layers.

5. The device of claim 1, wherein the at least one layer is GaN and the other layers are AlInN.

6. The device of claim 1, wherein the at least one layer is InGaN and the other layers are AlGaN.

7. The device of claim 1, wherein the at least one layer is a first plurality of layers alternating with a second plurality of layers of the plurality of layers, the first plurality of layers each having a first index of refraction, and the second plurality of layers each have a second index of refraction different from the first index of refraction.

8. The device of claim 7, wherein the first plurality of layers have a first composition, and the second plurality of layers have a second composition different from the first composition.

9. The device of claim 7, wherein the first plurality of layers has a first porosity, and the second plurality of layers has a second porosity different from the first porosity.

10. The device of claim 7, wherein the first plurality of layers has a first n-type dopant concentration, and the second plurality of layers has a second n-type dopant concentration different from the first n-type doping concentration.

\* \* \* \* \*